United States Patent [19]
Matsumoto et al.

[11] Patent Number: 6,101,077
[45] Date of Patent: *Aug. 8, 2000

[54] ELECTROSTATIC PROTECTION CIRCUIT OF A SEMICONDUCTOR DEVICE

[75] Inventors: Toru Matsumoto, Sirakawa; Yasuaki Otaka, Bato-machi; Takashi Sumiya, Yuzukami-mura, all of Japan

[73] Assignee: Nippon Precision Circuits Inc., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/128,596

[22] Filed: Aug. 3, 1998

[30] Foreign Application Priority Data

Aug. 4, 1997 [JP] Japan ................................. 9-209266

[51] Int. Cl.$^7$ ........................................... H02H 9/04
[52] U.S. Cl. ............................................. 361/111; 361/56
[58] Field of Search .......................... 361/56, 91.5, 111; 257/355

[56] References Cited

U.S. PATENT DOCUMENTS

| | | | |
|---|---|---|---|
| 5,345,357 | 9/1994 | Pianka | 361/56 |
| 5,745,323 | 4/1998 | English et al. | 361/56 |
| 5,917,689 | 6/1999 | English et al. | 361/56 |

*Primary Examiner*—Jeffrey Gaffin
*Assistant Examiner*—Kim Huynh
*Attorney, Agent, or Firm*—Amster, Rothstein & Ebenstein

[57] ABSTRACT

An electrostatic protection circuit of a semiconductor device comprises a first MOS transistor of specific conductive type and a second MOS transistor of the specific conductive type. In the first MOS transistor, a drain thereof is connected to an output terminal or an input terminal and a source thereof is connected to a first power terminal and the first MOS transistor is controlled to be on/off by a signal received by a gate or ordinarily turned off by holding the gate at a specific potential. In the second MOS transistor of the specific conductive type, a drain thereof is connected to the output terminal or the input terminal and a source thereof is connected to a gate of the first MOS transistor and the second MOS transistor is ordinarily turned off by connecting a gate thereof to the first power terminal.

6 Claims, 3 Drawing Sheets us patent 6,101,077

ELECTROSTATIC PROTECTION CIRCUIT OF A SEMICONDUCTOR DEVICE

BACKGROUND OF THE INVENTION

1. Field of the Invention

This invention relates to an electrostatic protection circuit of a semiconductor device and more particularly to an electrostatic protection circuit of an open drain output circuit and input circuit.

2. Description of the Prior Art

Conventionally, various types of electrostatic protection circuits have been used to protect an output terminal or input terminal of a MOS semiconductor device. For example, in an open drain output circuit having a structure shown in FIG. 5(a), a parasitic diode d1 existing between a drain of an N channel type MOS transistor tr1 and power terminal VSS (0V as substrate potential) is used as a protection circuit. That is, if a high positive surge voltage is applied to an output terminal OUT with respect to a power terminal VSS, the surge current is made to escape to the power terminal VSS through a breakdown of the parasitic diode d1 so as to prevent a destruction of the MOS transistor tr1.

According to a second example shown in FIG. 5(b), in addition to the parasitic diode d1, a MOS transistor tr2 in which its drain is connected to an output terminal, its source is connected to a power terminal VDD and its gate is connected to a power terminal VSS so that it is turned off is provided as the protection circuit. In this case, if a high positive surge voltage is applied to the output terminal with respect to the power terminal VSS, the surge current is made to escape through the same path as shown in FIG. 5(a) and simultaneously the surge current is made to escape to the power terminal VDD through the drain and source of the MOS transistor tr2 causing break down. The surge current flows to the power terminal VSS through a parasitic diode d2 existing between the power terminal VDD and power terminal VSS.

As for the protection circuit for the input terminal, as shown in FIG. 5(c), generally diodes d3, d4 have been disposed.

However, because there is no protection circuit between the power terminal VDD and output terminal in the example shown in FIG. 5(a), electrostatic discharge (ESD) withstanding voltage is low, and therefore a special process is needed to raise this voltage.

In the example shown in FIG. 5(b), although the ESD withstanding voltage can be raised by adding the MOS transistor tr2 between the power terminal VDD and output terminal, it is necessary to increase a size of the MOS transistor tr2 thereby inducing an increase of the circuit size.

In the protection circuit for the input terminal shown in FIG. 5(c), because the diode d4 exists between the input terminal IN and power terminal VDD, an input signal having a higher potential than the power terminal VDD cannot be used. That is, this circuit is not capable of receiving an input signal from a semiconductor device having a different voltage.

SUMMARY OF THE INVENTION

Accordingly, an object of the present invention is to provide an electrostatic protection circuit of a semiconductor device not requiring any special process or increased size of the second MOS transistor to secure a high electrostatic discharge withstanding voltage and capable of receiving an input signal from a semiconductor device having a different power voltage.

Therefore, according to the present invention, to protect a first MOS transistor of specific conductive type in which a drain of a first MOS transistor is connected to an output terminal or input terminal and a source thereof is connected to a first power terminal and which is controlled to be on/off by a signal received by a gate or ordinarily turned off by holding the gate at a specific voltage, a second MOS transistor is disposed between the drain and gate of the first MOS transistor. Therefore, if a surge voltage produced by electrostatic discharge is applied to the output terminal or input terminal, break-down occurs in the second MOS transistor so that a voltage generated by this break-down current turns on the first MOS transistor. As a result, the surge current flowing from the output terminal or input terminal is made to escape to the first power terminal through the first MOS transistor thereby protecting from a destruction due to electrostatic discharge. The second MOS transistor has only to be as large as capable of turning on the first MOS transistor so that the ESD withstanding voltage can be increased without increasing the circuit size. Further, by connecting the drain of the first MOS transistor to the input terminal, this circuit is capable of receiving an input signal from a semiconductor device having a different power voltage.

According to the present invention, there is provided an electrostatic protection circuit of a semiconductor device comprising: a first MOS transistor of specific conductive type in which a drain thereof is connected to an output terminal or an input terminal and a source thereof is connected to a first power terminal and which is controlled to be on/off by a signal received by a gate or ordinarily turned off by holding the gate at a specific potential; and a second MOS transistor of the specific conductive type in which a drain thereof is connected to the output terminal or the input terminal and a source thereof is connected to a gate of the first MOS transistor and which is ordinarily turned off by connecting a gate thereof to the first power terminal.

Preferably, the first MOS transistor is an open drain output circuit in which a drain thereof is connected to an output terminal and which generates an output signal to the output terminal depending on an input signal from a gate thereof.

Further, preferably, the first MOS transistor is so constructed that a drain thereof is connected to an input terminal and ordinarily a gate thereof is maintained at a specific potential and turned off.

Further, preferably, a power voltage is applied between a second power terminal having a different potential from that of the first power terminal and the first power terminal, and the input terminal receives an input signal in which a potential of the first power terminal is a reference potential thereof and which has the same polarity as the polarity of the power voltage.

Further, preferably, the second MOS transistor has a withstanding voltage between a drain and source which is lower than the withstanding voltage between the drain and source of the first MOS transistor.

DESCRIPTION OF THE PREFERRED EMBODIMENTS

Figure 1:
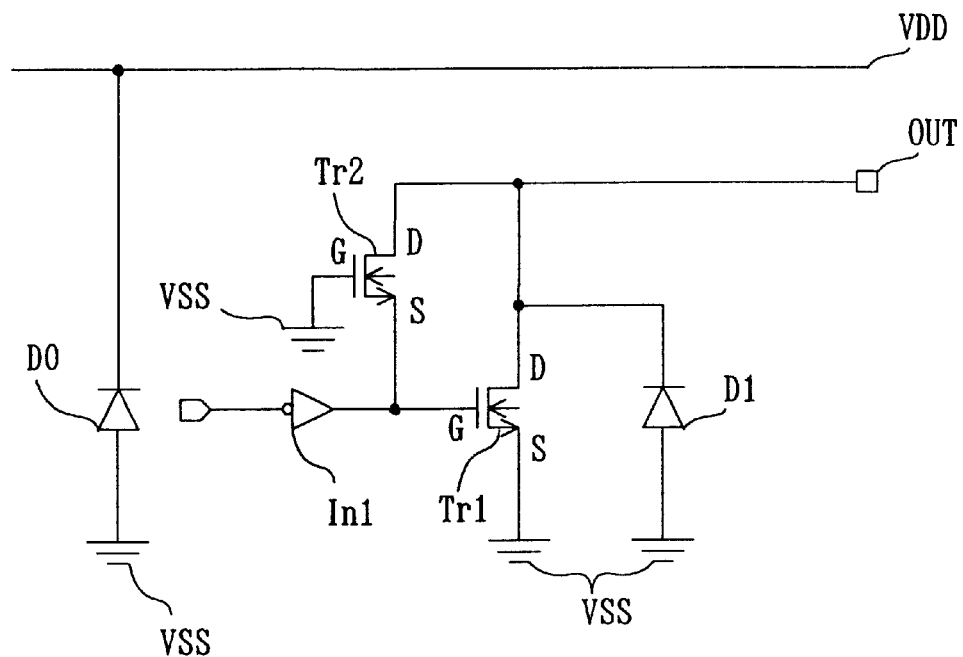
FIG. 1 is a diagram for explaining a structure of a protection circuit of a semiconductor device according to a first embodiment of the present invention.
Figure 5:
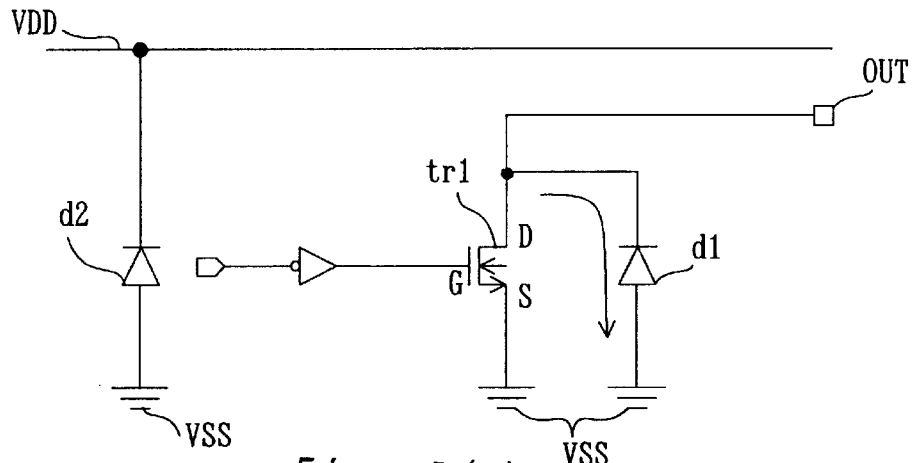
FIGS. 5a–5c is a diagram for explaining a structure of a protection circuit of a conventional semiconductor device.
Figure 5:
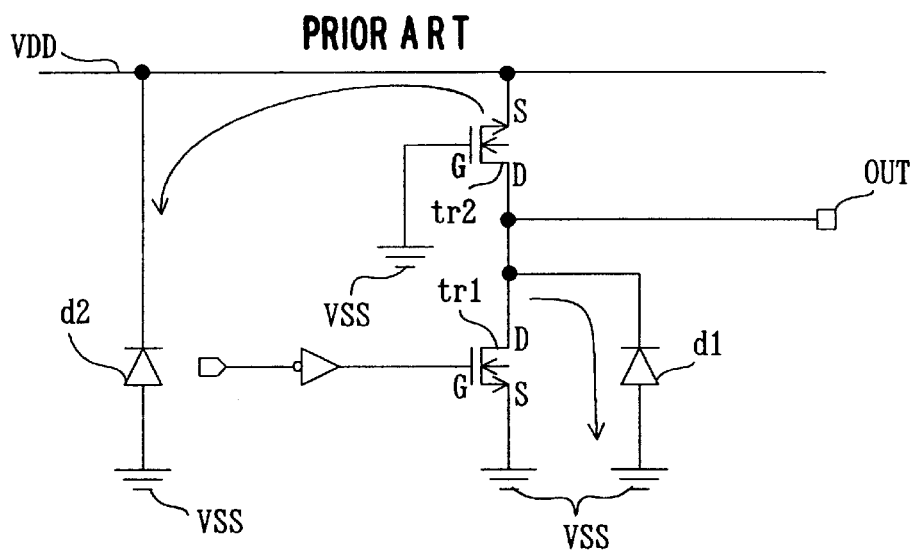
Figure 5:
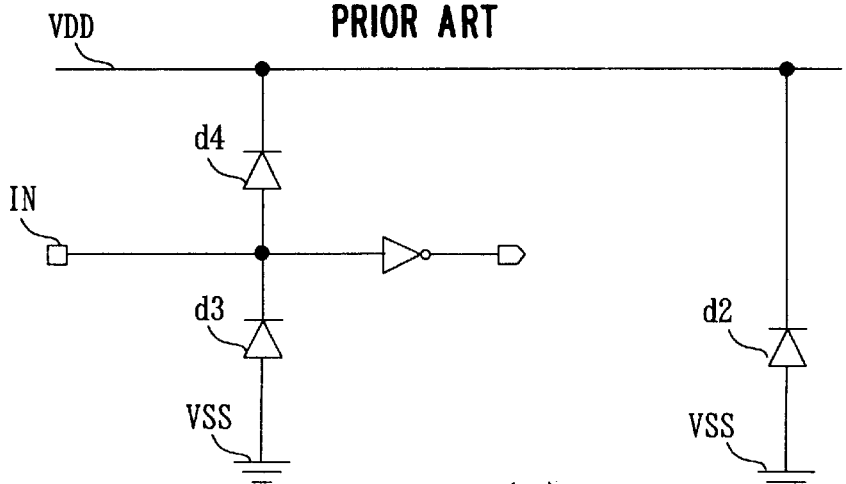

An electrostatic protection circuit of a semiconductor device according to a first embodiment of the present invention will be described. This embodiment is intended for protecting an output terminal from electrostatic discharge. FIG. 1 is an explanatory diagram for explaining a structure of this embodiment. The same reference numeral as those of FIG. 5 indicate the same components and this is the same in respective drawings which will be described later. Referring to FIG. 1, Tr1 denotes a N channel type MOS transistor, in which its drain is connected to an output terminal OUT and its source is connected to a power terminal VSS. This is an open drain output circuit which generates an output signal to the output terminal OUT corresponding to an input signal received by a gate from an invertor circuit In1. D1 is a parasitic diode of the MOS transistor Tr1. Do is a parasitic diode existing between the power terminal VSS and power terminal VDD.

Tr2 is an N channel type MOS transistor in which its drain is connected to the output terminal OUT, its source is connected to the gate of the MOS transistor Tr1 and its gate is connected to a power terminal VSS so that it is turned off in normal condition. The MOS transistor Tr2 is set so that a channel length thereof is shorter than that of the MOS transistor Tr1 and has a lower withstanding voltage between the drain and source than the withstanding voltage between the drain and source of the MOS transistor Tr1. It is needless to say that setting of the withstanding voltage between the drain and source can be made by process as well as depending on the channel length.

An operation of this embodiment will be described.

If a positive surge voltage is applied to the output terminal OUT with respect to the power terminal VSS by electrostatic discharge, the MOS transistor Tr2 having a lower withstanding voltage between the drain and source causes a break-down first and this break-down current flows between the drain and source. As a result, the break-down current flows through a parasitic diode (not shown) existing between the output terminal of the invertor In1 and power terminal VSS so that a voltage caused therefrom is applied between the gate and source of the MOS transistor Tr1. Then, the MOS transistor Tr1 is turned on so that the surge current flowing from the output terminal OUT flows through the drain and source of the MOS transistor Tr1 finally to the power terminal VSS. As a result, the MOS transistor Tr1 which is an open drain output circuit, MOS transistor Tr2 and an internal circuit of the invertor In1 and the like are protected from surge current. That is, the MOS transistor Tr1 which is an open drain circuit acts as a part of the protection circuit. Therefore, a tolerance relative to the surge current can be increased as compared to a case in which only the parasitic diode d1 shown in FIG. 5(a) is used as a protection circuit. Generally, the MOS transistor Tr1 has a large current tolerance as an open drain output circuit and is effective as a protection circuit. The MOS transistor Tr2 have only to have as large a capacity as capable of turning on the MOS transistor Tr1 when the surge voltage is applied to the output terminal OUT and therefore its size may be smaller than that of the MOS transistor Tr1. That is, according to this embodiment, by using the MOS transistor Tr2 having a smaller size, the MOS transistor Tr1 having a relatively large current tolerance is controlled so that the surge current is made to escape to the power terminal VSS through the drain and source of the MOS transistor Tr1. Therefore, as compared to a case of installing an additional MOS transistor having a larger size shown as FIG. 5(b), the same ESD withstanding voltage can be achieved with a smaller circuit. In other words, by increasing the MOS transistor Tr1, a higher ESD withstanding voltage can be achieved with the same circuit size as conventionally. Although needless to say, the MOS transistors Tr1, Tr2 are formed at the same time and therefore the protection circuit can be formed without any special process according to this embodiment.

The MOS transistor Tr2 makes a break-down current flow when the surge voltage is applied to the output terminal so that the MOS transistor Tr1 is turned on. It is needless to say that the protective effect of the MOS transistor tr1 or the like is higher when the break-down occurs in the MOS transistor Tr2 earlier than it occurs in the MOS transistor Tr1. Therefore, in this embodiment, the withstanding voltage between the drain and source of the MOS transistor Tr2 is set so as to be lower than the withstanding voltage between the drain and source of the MOS transistor Tr1, so that the break-down occurs in the MOS transistor Tr2 earlier than it occurs in the MOS transistor Tr1. Even if the break-down occurs in the MOS transistors Tr1, Tr2 at the same time, the MOS transistor Tr1 is turned on by the MOS transistor Tr2's break-down just after, so as to achieve the above described protective action. Therefore, the withstanding voltage between the drain and source of the MOS transistors Tr1, Tr2 can be set to substantially the same value. However, at least the above mentioned protective action needs to be carried out before the MOS transistor Tr1 is destroyed and the withstanding voltage between the drain and source of the MOS transistor Tr2 should be set to such a value. Therefore, the withstanding voltage between the drain and source of the MOS transistor Tr2 is preferred to be set to below that of the MOS transistor Tr1.

Figure 2:
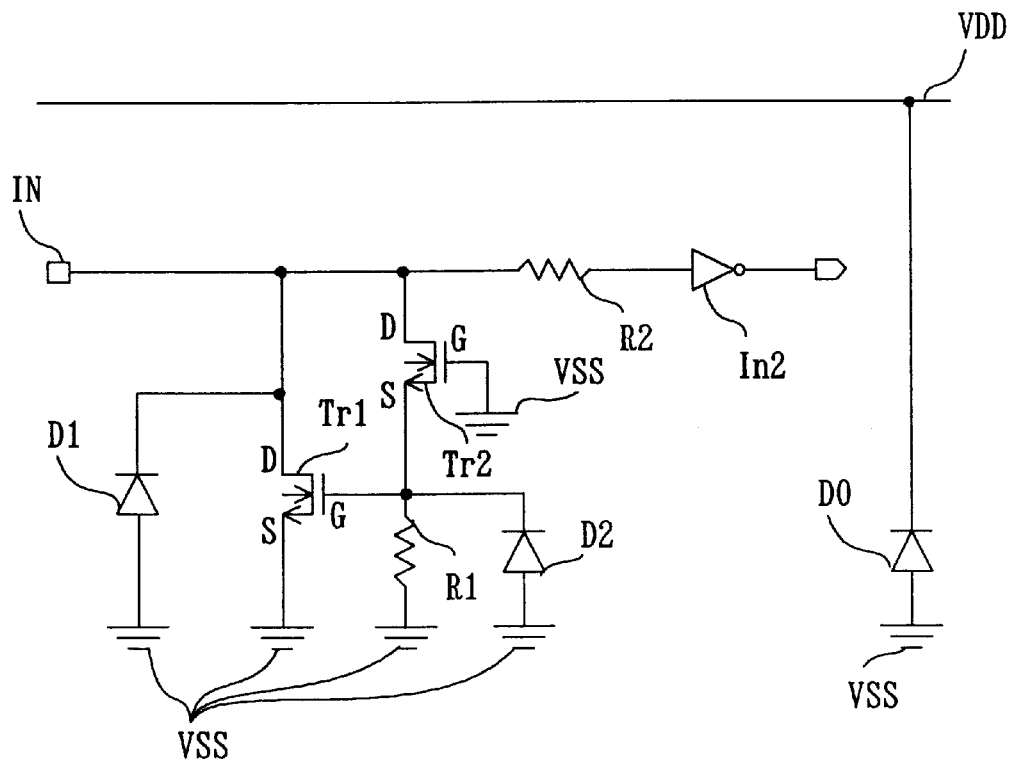
FIG. 2 is a diagram for explaining a structure of a protection circuit of a semiconductor device according to a second embodiment of the present invention.

Next, a protection circuit of a semiconductor device according to a second embodiment of the present invention will be described. Although the case of protecting the output terminal from electrostatic has been described in the above embodiment, this embodiment refers to a case of protecting an input terminal from electrostatic discharge. FIG. 2 is an explanatory view for explaining a structure of this embodiment. In this embodiment, a drain of the MOS transistor Tr1 is connected to an input terminal IN and a gate thereof is connected to a power terminal VSS through a resistor R1 so that usually it is turned off. Likewise, a drain of the MOS transistor Tr2 is connected to an input terminal IN. An invertor In2 is operated by receiving an input signal from the input terminal IN through a resistor R2. D2 denotes a diode, which protects the gate of the MOS transistor Tr1 when the MOS transistor Tr2 is turned on and causes such a current that turns on the MOS transistor Tr1 when the break-down current flows though the MOS transistor Tr2. An appropriate parasitic diode is used for the diode D2. Although not shown in the above first embodiment, the parasitic diode of the N channel MOS transistor composing the invertor In1 serves this function. In this embodiment, the first and second power terminals are power terminals VSS and VDD respectively.

In this embodiment also, if a positive surge voltage is applied to the input terminal IN with respect to the power terminal VSS as standard, a break-down occurs in the MOS transistor Tr2 so that the MOS transistor Tr1 is turned on. Then, the surge current flowing from the input terminal IN is made to escape to the power terminal VSS through the drain and source of the MOS transistor Tr1 thereby preventing the invertor In2 from being destroyed by electrostatic.

That is, the same operation and effect as the first embodiment are attained.

Because there is not diode d4 provided for protection from electrostatic discharge with a direction to the power terminal VDD as forward, between the input terminal IN and power terminal VDD unlike the conventional example shown in FIG. 5(c), there never occurs a case in which current flows from the signal source into the power terminal VDD thereby changing the power voltage even if an input signal producing a higher potential than the power terminal VDD is received. That is, a large voltage signal having the same reference potential and polarity as the power voltage of this embodiment, concretely a signal having a higher potential than the power terminal VDD with respect to the potential of the power terminal VSS can be inputted. In other words, if the power terminal of lower potential side is of the same potential as the power terminal VSS of this embodiment, a signal from a semiconductor device operating under a larger voltage than that of the semiconductor device can be received.

Figure 3:
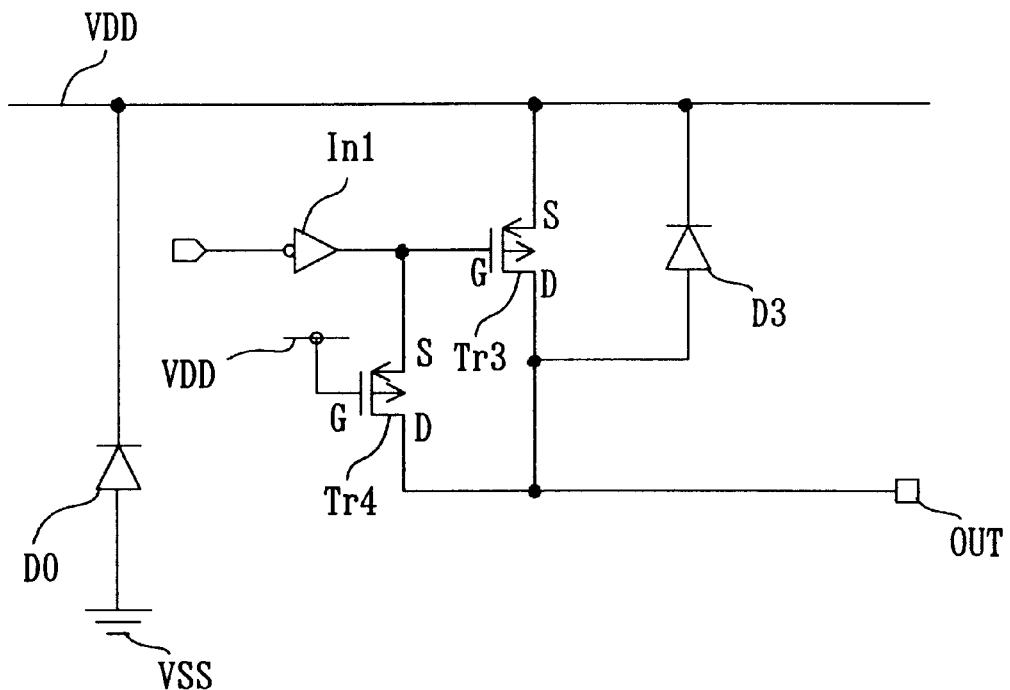
FIG. 3 is a modification of the first embodiment.
Figure 4:
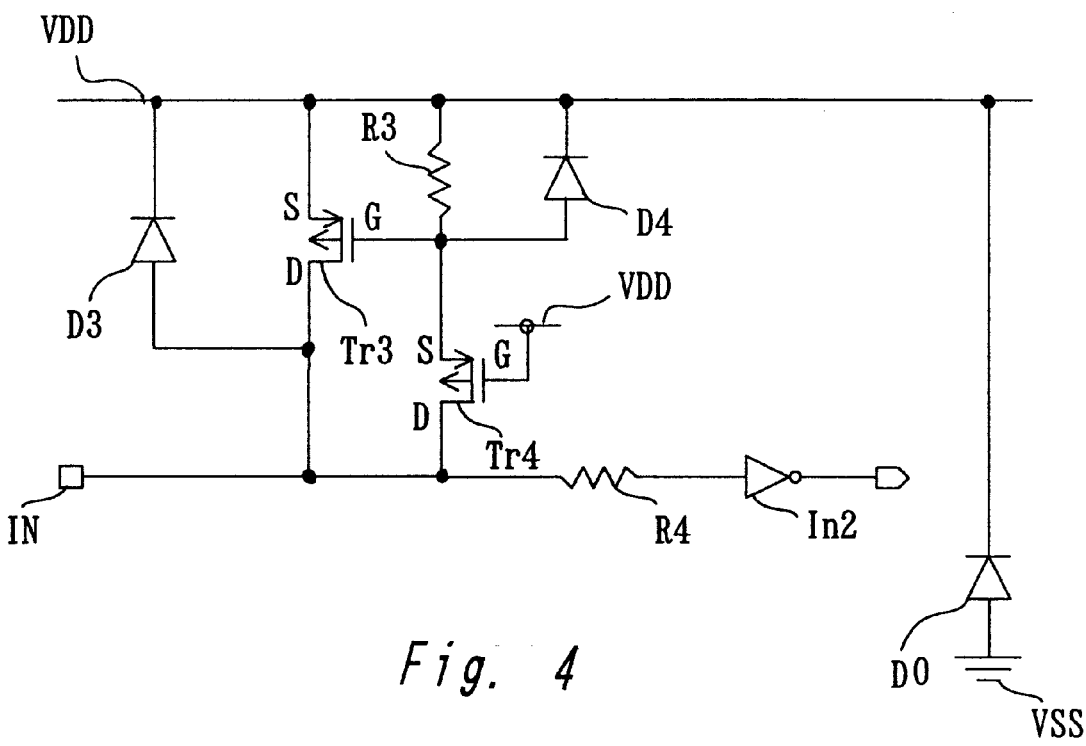
FIG. 4 is a modification of the second embodiment.

Although the N channel MOS transistor is used as the MOS transistor in the respective embodiments, the present invention is not restricted to this, but the P channel MOS transistor may be used. For example, the structure shown in FIG. 1 may be configured as shown in FIG. 3 and the structure shown in FIG. 2 may be configured as shown in FIG. 4. In such a case also, the same operation and effect as the aforementioned N channel type structure can be attained. In these Figures, Tr3 and Tr4 denote P channel MOS transistors corresponding to the MOS transistors Tr1, Tr2 and D3, D4 denote diodes corresponding to diodes D1, D2. R3, R4 denote resistors corresponding to resistors R1, R2. In FIG. 4, the first and second power terminals are represented as power terminals VDD, VSS, respectively. In this case also, a disadvantage of a case when an input signal is received from other semiconductor device (not shown) having a different power voltage can be eliminated. That is, in the semiconductor device shown in FIG. 4 and a semiconductor device generating an input signal, if the power terminal (in FIG. 4, power terminal VDD) of higher potential side is set to common reference potential, for example, 0 V, the potential of the power terminal VSS of lower potential side of the semiconductor device shown in FIG. 4 is −a V and the potential of the power terminal of lower potential side of the semiconductor device producing a signal is −b V (a<b), it is possible to receive a signal from a semiconductor device operated under a larger power voltage (in this case, the polarity is negative) than that shown in FIG. 4 like FIG. 2.

What is claimed is:

1. An electrostatic protection circuit of a semiconductor device comprising:
   a first MOS transistor of specific conductive type having a gate, drain and source in which said drain is connected to an output terminal and said source is connected to a first power terminal and which is turned on/off by a signal received by said gate; and
   a second MOS transistor of said specific conductive type having a gate, drain and source in which said drain thereof is connected to said output terminal and said source is connected to said gate of said first MOS transistor and wherein said second MOS transistor is ordinarily turned off by connecting said gate thereof to the first power terminal, and said second MOS transistor has a withstanding voltage between said drain and source which is lower than the withstanding voltage between the drain and said source of said first MOS transistor such that an electrostatic discharge applied to said second MOS transistor causes a breakdown current to flow between the source and drain of said second MOS transistor which acts to turn on said first MOS transistor for carrying said electrostatic discharge to said first power terminal.

2. An electrostatic protection circuit of a semiconductor device according to claim 1 wherein said first MOS transistor is an open drain output circuit and which generates an output signal to the output terminal depending on an input signal from said gate.

3. An electrostatic protection circuit of a semiconductor device according to claim 1 wherein said gate of said first MOS transistor is ordinarily turned off by holding the gate at a specific potential.

4. An electrostatic protection circuit of a semiconductor device comprising:
   a first MOS transistor of specific conductive type having a gate, drain and source in which said drain is connected to an input terminal and said source is connected to a first power terminal and which is turned on/off by a signal received by said gate; and
   a second MOS transistor of said specific conductive type having a gate, drain and source in which said drain thereof is connected to said input terminal and said source is connected to said gate of said first MOS transistor and wherein said second MOS transistor is ordinarily turned off by connecting said gate thereof to the first power terminal, and said second MOS transistor has a withstanding voltage between said drain and source which is lower than the withstanding voltage between said drain and source of said first MOS transistor such that an electrostatic discharge applied to said second MOS transistor causes a breakdown current to flow between the source and drain of said second MOS transistor which acts to turn on said first MOS transistor for carrying said electrostatic discharge to said first power terminal.

5. An electrostatic protection circuit of a semiconductor device according to claim 4 wherein said first MOS transistor is so constructed that ordinarily said gate thereof is maintained at a specific potential and turned off.

6. An electrostatic protection circuit of a semiconductor device according to claim 5 wherein a power voltage is applied between a second power terminal having a different potential from that of said first power terminal and said first power terminal, and said input terminal receives an input signal in which a potential of said first power terminal is a reference potential thereof and which has the same polarity as the polarity of said power voltage.

* * * * *